(12) United States Patent
Tanaka

(10) Patent No.: US 6,456,117 B2
(45) Date of Patent: Sep. 24, 2002

(54) SHIELD CIRCUIT AND INTEGRATED CIRCUIT IN WHICH THE SHIELD CIRCUIT IS USED

(75) Inventor: Genichi Tanaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/759,448

(22) Filed: Jan. 16, 2001

(30) Foreign Application Priority Data

Jul. 24, 2000 (JP) ........................................ 2000-222668

(51) Int. Cl.[7] .............................................. H03K 17/16
(52) U.S. Cl. ......................... 326/101; 326/47; 326/26; 326/15
(58) Field of Search .......................... 326/101, 15, 26, 326/30, 82, 47

(56) References Cited

U.S. PATENT DOCUMENTS 5,994,946 A * 11/1999 Zhang ........................ 327/403
6,184,702 B1 * 2/2001 Takahashi et al. ............. 326/21
6,239,615 B1 * 5/2001 Ngai et al. ..................... 326/41
6,285,208 B1 * 9/2001 Ohkubo ....................... 326/15

FOREIGN PATENT DOCUMENTS

JP   3-286568   12/1991
JP   8-306867   11/1996

OTHER PUBLICATIONS

U.S. application No. 09/759,262, Genichi Tanaka, filed Jan. 16, 2001, co-pending application.

* cited by examiner

Primary Examiner—Michael Tokar
Assistant Examiner—Vibol Tan
(74) Attorney, Agent, or Firm—Burns, Doane, Swecker & Mathis, LLP

(57) ABSTRACT

A shield circuit includes shielding wires and a shielding wire driving circuit, the shielding wires being provided along a target wire that requires shielding, and the shielding wire driving circuit driving the shielding wires with a logical value corresponding to a logical value of at least one of inputs to a cell that drives the target wire.

1 Claim, 6 Drawing Sheets

SHIELD CIRCUIT AND INTEGRATED CIRCUIT IN WHICH THE SHIELD CIRCUIT IS USED

BACKGROUND OF THE INVENTION

1. Field of the Invention

The present invention generally to a shield circuit for shielding a wire and an integrated circuit in which the shield circuit is used to shield at least a portion of the wires.

2. Description of the Related Art

FIG. 6 is a circuit diagram showing a shield circuit according to the related art. Referring to FIG. 6, reference numeral 101 indicates a wire subject to shielding, 102 indicates a cell for driving the wire 101 based on values at inputs 104 and 105, 103 indicates a cell connected to the cell 102 via the wire 101, and 106 and 107 indicate shielding wires that are grounded to provide shielding.

A description will now be given of the operation according to the related art.

The shielding wires 106 and 107 are grounded so that the wire 101 is shielded from other wires (not shown).

With this shielding of the wire 101, noise such as cross talk is suppressed and the magnitude of inductance with respect to other wires is reduced.

The shielding according to the related art, however, has a drawback in that capacitance between the shielding wires 106, 107 and the wire 101 is increased so that the delay of a signal traveling in the wire 101 is increased.

One approach to reduce the delay in signal propagation is ensure that the potential of the shielding wire is identical with the target wire subject to shielding. FIG. 7 is a circuit diagram of another related-art shield circuit disclosed in Japanese Laid-Open Patent Application No. 8-306867. Referring to FIG. 7, reference numeral 121 indicates a wire subject to shielding, 131 indicates a cell that drives the wire 121, 122L and 122R indicate shielding wires provided to sandwich the wire 121 and in the same layer as the wire 121. Numeral 123 indicates a shielding wire provided in another layer and 132 indicates a cell of the same type as the cell 131, for driving the shielding wires 122L, 122R and 123.

A description will be given of the operation according to the alternative related art.

Signals propagated through the wire 121, the shielding wires 122L, 122R and 123 maintain the same phase. Even if the wire 121, and the shielding wires 122L, 122R and 123 are coupled by stray capacitance, no charging or discharging occurs as a result of the capacitance because of this same phase feature.

It is thus ensured that the target wire 121 is shielded and the delay in signal propagation caused by the capacitance between wires is reduced.

Since the alternative related art is constructed such that the cell 132 of the same cell type as the cell 131 that drives the target wire 121 is used to drive the shielding wires 122L, 122R and 123, it is difficult to reduce the scale of the shield circuit while reducing a delay in the signal propagation.

SUMMARY OF THE INVENTION

Accordingly, a general object of the present invention is to provide a shield circuit and an integrated circuit having the same, in which the aforementioned problem is eliminated.

Another and more specific object is to provide a shield circuit with a reduced circuit scale and an integrated circuit having the same, in which the delay in signal propagation is reduced by providing shielding wires along a target wire that requires shielding, and providing a shielding wire driving circuit that drives the shielding wires with a logical value corresponding to a logical value of at least one of inputs to the cell that drives the target wire.

The aforementioned objects can be achieved by a shield circuit for shielding a target wire that requires shielding, comprising: shielding wires provided along a target wire that requires shielding; and a shielding wire driving circuit for driving the shielding wires with a logical value corresponding to a logical value of at least one of inputs to a cell that drives the target wire.

The shielding wire driving circuit may comprise one of an inverter and a buffer.

The shielding wires may include a first shielding wire and a second shielding wire, and the shielding wire driving circuit may include a first circuit for driving the first shielding wire and a second circuit for driving the second shielding wire.

At least one of the shielding wires may be divided along the target wire to produce individual shielding wires.

The shielding wire driving circuit may drive the shielding wires using a cell having a lower driving capability than the cell that drives the target wire.

The aforementioned objects can be achieved by an integrated circuit in which a target wire that requires reduction in delay in signal propagation is shielded, comprising: a shield circuit for shielding the target wire, wherein the shield circuit is provided with shielding wires provided along the target wire and with a shielding wire driving circuit for driving the shielding wires with a logical value corresponding to a logical value of at least one of inputs to a cell that drives the target wire.

BRIEF DESCRIPTION OF THE DRAWINGS

Other objects and further features of the present invention will be apparent from the following detailed description when read in conjunction with the accompanying drawings, in which.

DETAILED DESCRIPTION OF THE PREFERRED EMBODIMENTS

First Embodiment

Figure 1:
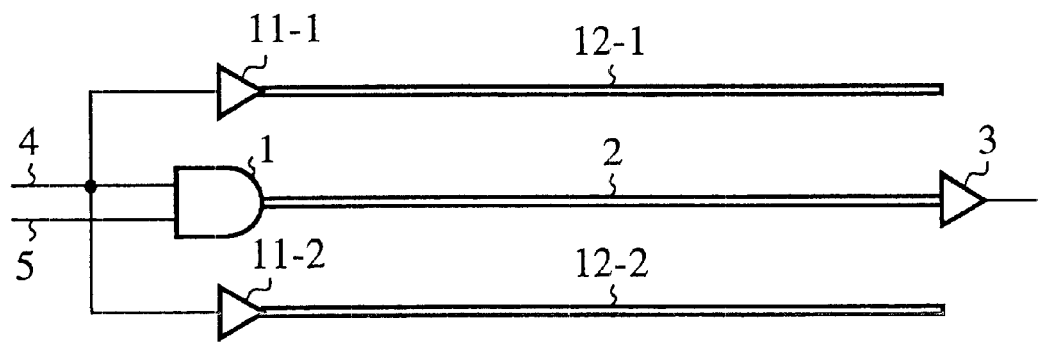
FIG. 1 is a circuit diagram showing a construction of a shield circuit according to a first embodiment of the present invention.

FIG. 1 is a circuit diagram showing a construction of a shield circuit according to a first embodiment of the present invention. A target wire 2 that requires shielding is driven by a cell 1 having inputs 4 and 5. A shielding wire 12-1 is driven by a buffer 11-1 (shielding wire driving circuit) with the same logical value as the logical value of the input 4. A shielding wire 12-2 is driven by a buffer 11-2 (shielding wire driving circuit) with the same logical value as the logical value of the input 4.

A description will now be given of the operation according to the first embodiment.

Since the cell 1 is an AND circuit, when the input 4 goes from logical 0 to logical 1, the output goes from logical 0 to logical 1 or remains logical 0. When the input 4 goes from logical 1 to logical 0, the output goes from logical 1 to logical 0 or remains logical 0.

The shielding wire driving circuit, constituted by the buffers 11-1 and 11-2, drives the shielding wires 12-1 and 12-2 as it keeps track of a variation in logical value occurring on the wire 2 resulting from a variation in logical value of the input 4.

Figure 9:
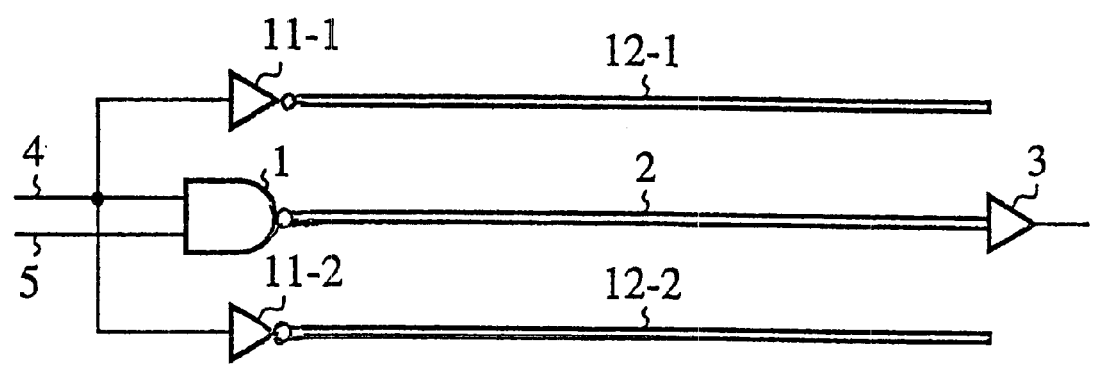
FIG. 9 is a circuit diagram showing a variation of the first embodiment.

Assuming that the cell 1 is a NAND circuit, the output of the cell 1 goes from logical 1 to 0 or remains logical 1, when the input goes from logical 0 to logical 1. When the input goes from logical 1 to logical 0, the output goes from logical 0 to logical 1 or remains logical 1. In this case, the shielding wire driving circuit, constituted by inverters, (see FIG. 9), drives the shielding wires 12-1 and 12-2 as it keeps track of a variation in logical value occurring on the wire 2 resulting from a variation in logical value of the input 4.

The cell is described above as receiving the two inputs 4 and 5. Alternatively, the cell 1 may be a three-input cell.

As has been described, the first embodiment ensures that the shielding wire driving circuit drives the shielding wires 12-1 and 12-2 provided along the target wire 2 that requires shielding. The shielding wire driving circuit, constituted by the buffers 11-1 and 11-2, drives the shielding wires 12-1 and 12-2 with a logical value corresponding to a logical value of one (input 4) of the two inputs 4 and 5 to the cell 1 that drives the target wire 2 with logical values at the inputs 4 and 5. Accordingly, it is possible to reduce a delay in variation in logical value occurring on the wire 2, caused by a variation in logical value of the input 4 of the cell 1 driving the target wire 2. Moreover, the circuit scale is reduced by employing the buffers 11-1 and 11-2, which are smaller in circuit scale than the cell 1, to construct the shielding wire driving circuit.

Figure 8:
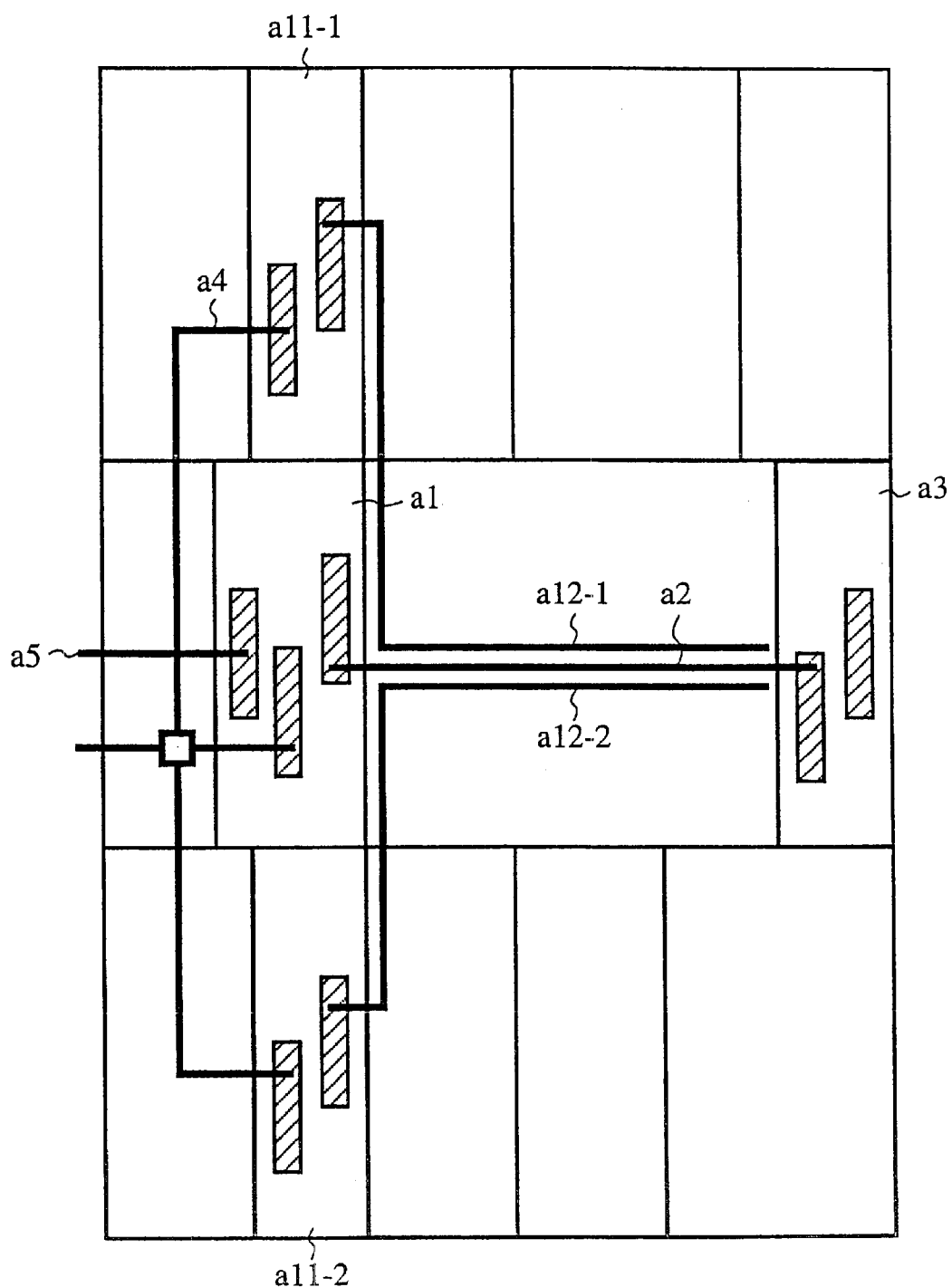
FIG. 8 shows a layout of shielding wires in an integrated circuit according to the first embodiment.

FIG. 8 shows a layout of the shielding wires according to the first embodiment in an integrated circuit. Referring to the integrated circuit of FIG. 8, reference symbol al indicates a portion of the integrated circuit embodying the cell 1, a2 indicates the wire 2, a3 indicates the cell 3, a4 indicates a wire that carries the input 4, a5 indicates a wire that carries the input 5, a11-1 indicates the cell 11-1, a11-2 indicates the cell 11-2, a12-1 indicates the shielding wire 12-1, and a12-2 indicates the shielding wire 12-2.

Second Embodiment

Figure 2:
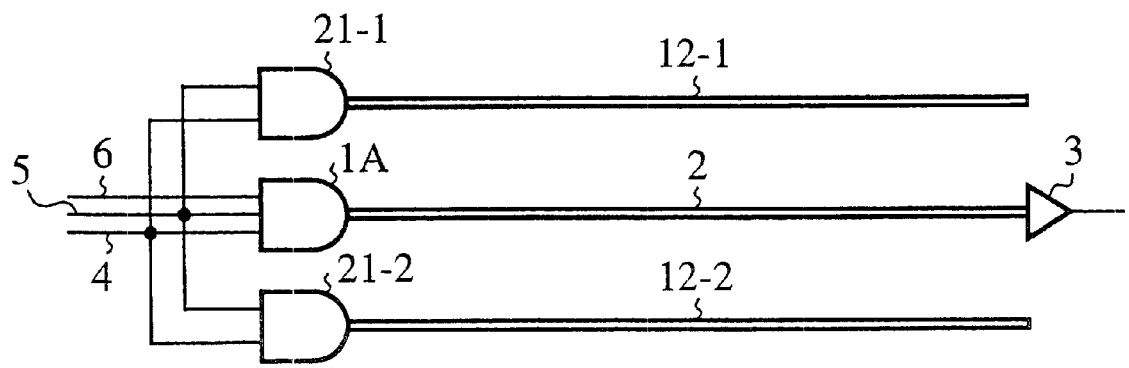
FIG. 2 is a circuit diagram showing a construction of a shield circuit according to a second embodiment of the present invention.

FIG. 2 is a circuit diagram showing a construction of a shield circuit according to a second embodiment of the present invention. Referring to FIG. 2, a cell 1A drives the target wire that requires shielding and receives three inputs 4, 5 and 6. An AND circuit (shielding wire driving circuit) 21-1 drives the shielding wire 12-1 based on logical values of the inputs 4 and 5. An AND circuit (shielding wire driving circuit) 21-2 drives the shielding wire 12-2 based on logical values of the inputs 4 and 5. The other components of the second embodiment are the same as the corresponding components in the first embodiment so that the description thereof is omitted.

A description will now be given of the operation according to the second embodiment.

Since the cell 1A is an AND circuit, the output of the cell 1A goes from logical 0 to logical 1 or remains logical 0, when the input 4 or input 5 goes from logical 0 to logical 1. When the input 4 or input 5 goes from logical 1 to logical 0, the output goes from 1 to logical 0 or remains logical 0.

The shielding wire driving circuit, constituted by the two AND circuits 21-1 and 21-2, drives the shielding wires 12-1 and 12-2 as it follows a variation in logical value occurring on the wire 2 resulting from the inputs 4 and 5.

As has been described, the second embodiment ensures that the shielding wire driving circuit drives the shielding wires 12-1 and 12-2 provided along the target wire 2 that requires shielding. The shielding wire driving circuit, constituted by the AND circuits 21-1 and 21-2, drives the shielding wires 12-1 and 12-2 with logical values corresponding to logical values of the inputs 4 and 5 to the cell 1 that drives the target wire 2 with logical values at the inputs 4, 5 and 6. Accordingly, it is possible to reduce a delay in variation in logical value occurring on the wire 2, caused by a variation in logical value of the inputs 4 and 5 of the cell 1A driving the target wire 2. Moreover, the circuit scale is reduced.

Third Embodiment

Figure 3:
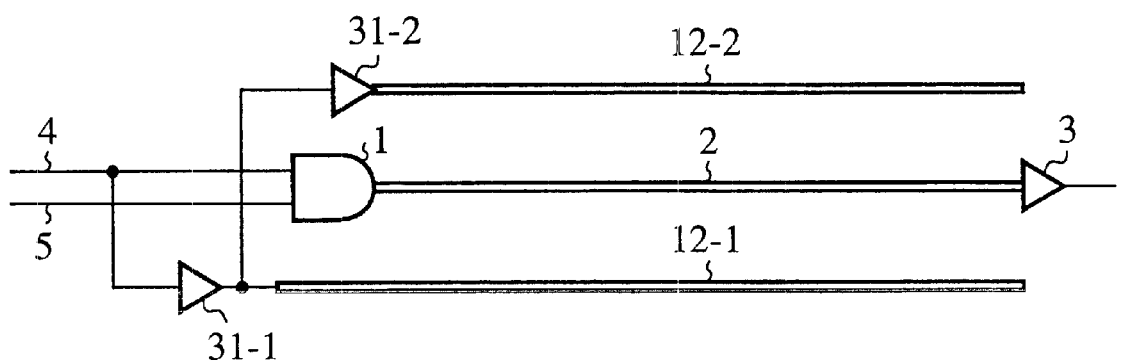
FIG. 3 is a circuit diagram showing a construction of a shield circuit according to a third embodiment of the present invention.

FIG. 3 is a circuit diagram showing a construction of a shield circuit according to a circuit drives one of the shielding wires and the buffer drives the other shielding wire.

According to the third embodiment, the buffers 31-1 and 31-2 for driving the shielding wires 12-1 and 12-2, respectively, are connected in series so that the capacitance with respect to the input 4 is reduced and the delay in signal propagation is reduced.

Fourth Embodiment

Figure 4:
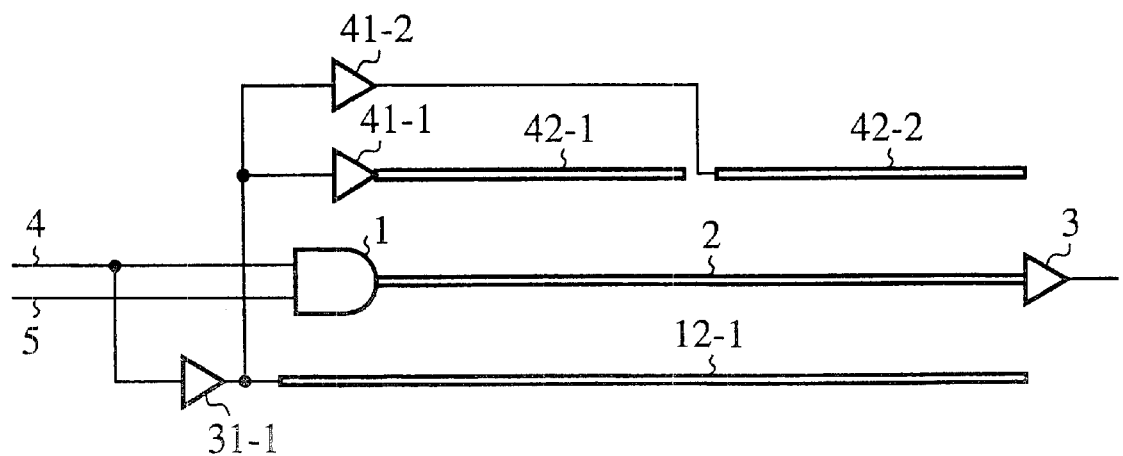
FIG. 4 is a circuit diagram showing a construction of a shield circuit according to a fourth embodiment of the present invention.

FIG. 4 is a circuit diagram showing a construction of a shield circuit according to a fourth embodiment of the present invention. Buffers 41-1 and 41-2 constitute a shielding wire driving circuit to drive individual shielding wires 42-1 and 42-2 provided along the wire 2 and constituting the shielding wire for shielding the wire 2. The other components of the fourth embodiment are the same as the corresponding components of the third embodiment so that the description thereof is omitted.

A description will now be given of the operation according to the fourth embodiment.

A description will now be given of the operation according to the fourth embodiment.

In the fourth embodiment, the indiviual shielding wires 42-1 and 42-2 provided along the wire 2 constitute the shielding wire such that each of the individual shielding wires 42-$i$ (i=1, 2) is driven by a buffer 41-$i$. The other aspects of the operation are the same as the corresponding aspects third embodiment of the present invention. The cell 1 drives the wire 2 and receives the two inputs 4 and 5. A buffer 31-1 (shielding wire driving circuit, first circuit) drives the shielding wire 12-1 (first shielding wire) with the same logical value as a logical value of the input 4. A buffer 31-2 (shielding wire driving circuit, second circuit) is connected in series with the buffer 31-1 and drives the shielding wire 12-2 (second shielding wire) with the same logical value as a logical value of the input 4. The other components are the same as the corresponding components of the first embodiment so that the description thereof is omitted.

A description will now be given the operation according to the third embodiment.

In the third embodiment, the buffers 31-1 and 31-2 are connected in series so as to constitute the shielding wire driving circuit. The buffer 31-1 drives the shielding wire 12-1 and the buffer 31-2 drives the shielding wire 12-2. The other aspects of the operation are the same as the corresponding aspects of the first embodiment so that the description thereof is omitted.

The buffers 31-1 and 31-2 according to the third embodiment are provided by connecting the buffers 11-1 and 11-2 in series. In an alternative construction, the AND circuits 21-1 and 21-2 of the second embodiment may be replaced by an AND circuit and a buffer connected in series so that the AND thereof is omitted.

In the description of the fourth embodiment given above, it is assumed that only one of the shielding wires is divided into individual shielding wires 42-1 and 42-2. Alternatively, both shielding wires may be divided into individual shielding wires. The shielding wire may also be divided into three individual shielding wires instead of two individual shielding wires depending on the length of the wire 2.

In the description of the fourth embodiment, it is assumed that the buffer 31-2 and the shielding wire 12-2 of the third embodiment are replaced by the buffers 41-1 and 41-2 and the individual shielding wires 42-1 and 42-2. Alternatively, the shielding wire of the first and second embodiment may be divided and driven individually.

As described above, according to the fourth embodiment, the shielding wire is divided and driven individually. Capacitance in the shielding wire per each cell (buffer 41-1 or 41-2 in the illustrated example) constituting the shielding wire driving circuit is reduced.

Fifth Embodiment

Figure 5:
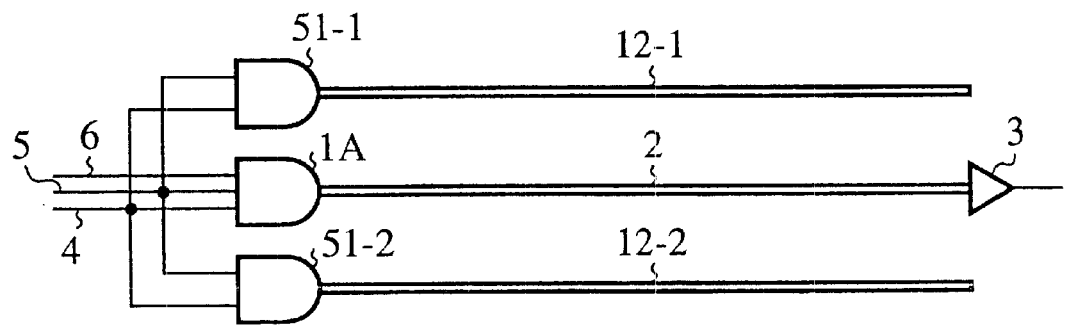
FIG. 5 is a circuit diagram showing a construction of a shield circuit according to a fifth embodiment of the present invention.
Figure 6:
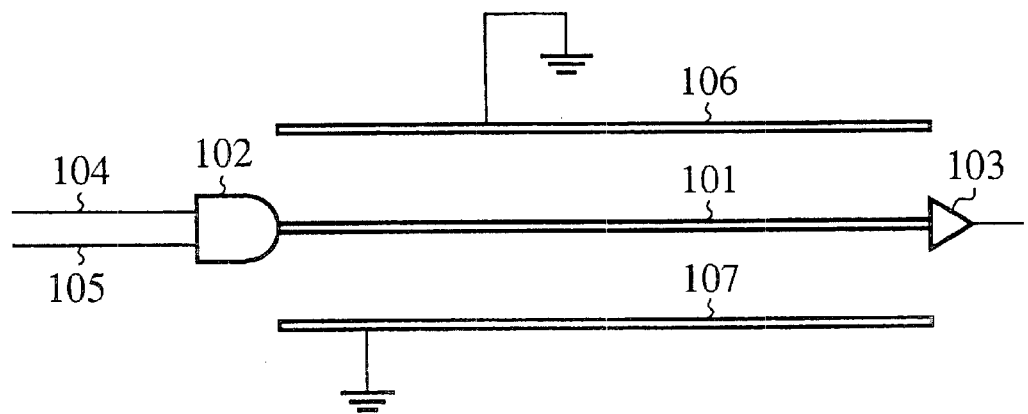
FIG. 6 is a circuit diagram showing a shield circuit according to the related art.
Figure 7:
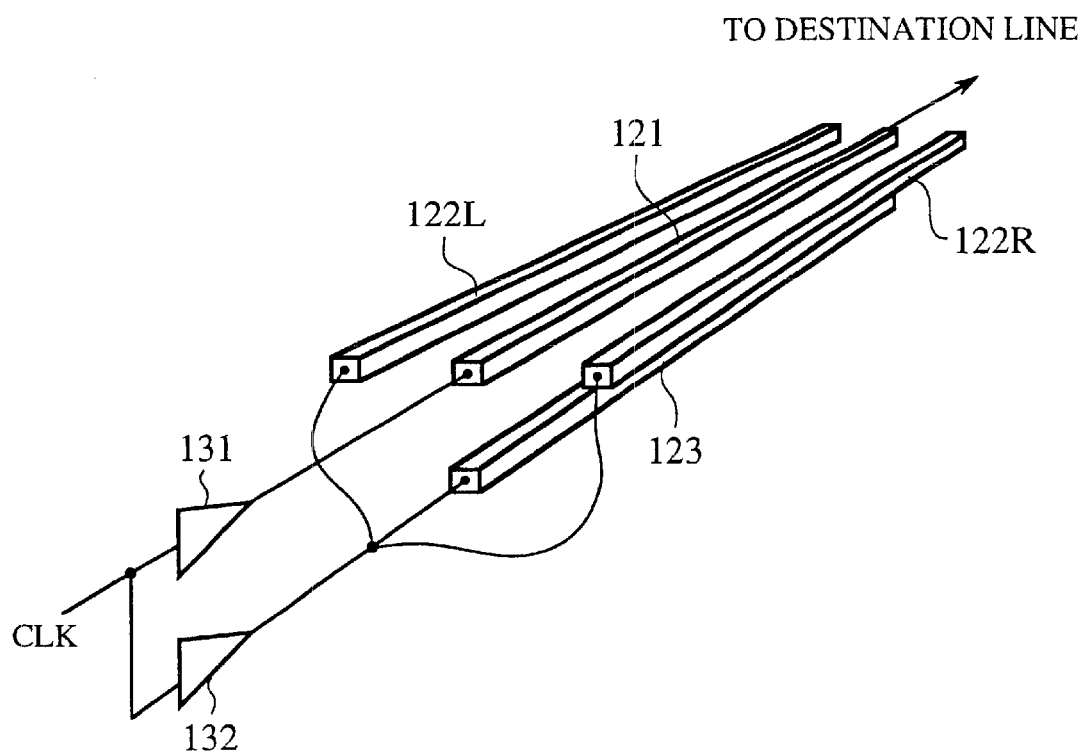
FIG. 7 is a circuit diagram showing a shield circuit according to the alternative related art.

FIG. 5 is a circuit diagram showing a construction of a shield circuit according to a fifth embodiment of the present invention. An AND circuit 51-1 (shielding wire driving circuit) drives the shielding wire 12-1 and has a lower driving capability than the cell 1. An AND circuit 51-2 (shielding wire driving circuit) drives the shielding wire 12-2 and has a lower driving capability than the cell 1. A low driving capability is defined as narrow channel width, large channel length, large (channel length/channel width) ratio of a transistor constituting the cell.

The other components of FIG. 5 are the same as the corresponding components of the second embodiment so that the description thereof is omitted.

A description will now be given of the operation according to the fifth embodiment.

In the fifth embodiment, the shielding wires 12-1 and 12-2 are driven by the AND circuits 51-1 and 51-2 having a comparatively lower driving capability. The other aspects of the operation are the same as the corresponding aspects of the second embodiment so that the description thereof is omitted.

Since the fifth embodiment ensures that the shielding wires 12-1 and 12-2 are driven by the AND circuits 51-1 and 51-2 having a comparatively lower driving capability, power consumption is reduced. Further, wires other than the shielding wires are more properly prevented from being affected by the shielding wires.

Using cells having a comparatively lower driving capability in the first, third and fourth embodiments would make the same advantage available.

The shield circuits according to the first through fifth embodiment are readily applicable to an integrated circuit.

The present invention is not limited to the above-described embodiments, and variations and modifications may be made without departing from the scope of the present invention.

What is claimed is:

1. A shield circuit for shielding a target wire that requires shielding, comprising:

shielding wires provided along a target wire that requires shielding; and shielding wire driving circuits for driving said shielding wires with a logical value corresponding to a logical value of at least one of inputs to a cell that drives the target wire, wherein said shielding wire driving circuit drives said shielding wires using a cell having a lower driving capability than the cell that drives the target wire.

* * * * *